United States Patent

Moriga

[11] Patent Number: 5,977,628
[45] Date of Patent: Nov. 2, 1999

[54] SEMICONDUCTOR DEVICE MOUNTED IN RESIN SEALED CONTAINER

[75] Inventor: Namiki Moriga, Itami, Japan

[73] Assignee: Mitsubishi Denki Kabushiki Kaisha, Tokyo, Japan

[21] Appl. No.: 08/168,185

[22] Filed: Dec. 17, 1993

[30] Foreign Application Priority Data

Dec. 18, 1992 [JP] Japan .................. 4-339053

[51] Int. Cl.⁶ .................. H01L 23/02
[52] U.S. Cl. .................. 257/710; 257/704
[58] Field of Search .................. 257/678, 701, 257/702, 704, 710, 711, 712, 787, 788, 789

[56] References Cited

U.S. PATENT DOCUMENTS

| | | | |
|---|---|---|---|
| 4,159,221 | 6/1979 | Schuessler | 257/704 |
| 5,064,968 | 11/1991 | Kovacs et al. | 257/704 |
| 5,117,281 | 5/1992 | Katsuraoka | 257/712 |
| 5,343,076 | 8/1994 | Katayama et al. | 257/710 |

FOREIGN PATENT DOCUMENTS

| | | |
|---|---|---|
| 472866 | 7/1991 | European Pat. Off. . |
| 62-021254 | 1/1987 | Japan . |
| 6237949 | 2/1987 | Japan .................. 257/710 |
| 63-084051 | 4/1988 | Japan . |
| 2185058 | 7/1990 | Japan . |
| 3145746 | 6/1991 | Japan . |
| 2242567 | 2/1991 | United Kingdom . |

*Primary Examiner*—Carl Whitehead, Jr.
*Attorney, Agent, or Firm*—Leydig, Voit & Mayer, Ltd.

[57] ABSTRACT

A plastic-molded hollow semiconductor device includes a base and a cover joined together by a thermosetting resin bonding material applied to the entire edge surfaces of the cover as well as bonding surfaces of the base and the cover. The thermosetting resin bonding material is applied after placing the cover on the base and simultaneously preheating them, whereby the gas trapped between the base and the cover is prevented from expanding, so that through-holes are eliminated, thereby making it possible to obtain a semiconductor device which provides a high level of handling property and reliability.

2 Claims, 9 Drawing Sheets

SEMICONDUCTOR DEVICE MOUNTED IN RESIN SEALED CONTAINER

BACKGROUND OF THE INVENTION

1. Field of the Invention

This invention relates to a plastic-molded-type hollow semiconductor device and a process for manufacturing the same.

2. Description of the Related Art

FIG. 13 is a schematic diagram showing the construction of a conventional plastic-molded-type hollow semiconductor device. In the drawing, a semiconductor element 1 is mounted on a base 2 having a cavity 4. The semiconductor element 1 and the base 2 are electrically connected to each other through metal wiring 3. A cover 5 is bonded to the base 2 by a bonding material 6 to define a closed space therebetween. Further, external terminals 7 electrically connected to an external device (not shown) are provided on the base 2.

The conventional plastic-molded-type hollow semiconductor device, constructed as described above, has been manufactured in the following manner: the semiconductor element 1 is mounted inside the cavity 4 of the base 2 which has the external terminals 7. Then, the base 2 is electrically connected with the semiconductor element 1 by the metal wiring 3, which is usually made of a material mainly consisting of gold, aluminum or the like.

The semiconductor device, which is manufactured in the above-described manner, is plastic-molded to seal the semiconductor element 1 therein, thereby obtaining requisite reliability and handling properties. In the semiconductor device shown in FIG. 13, the cover 5 is mounted on the base 2 and bonded thereto so that a closed space is formed including the cavity 4.

Generally speaking, the cover 5 consists of an insulating material, such as alumins whose surface has been treated into alumite, or a ceramic material. The base 2 may be made of a ceramic material in order to obtain high reliability and airtightness, or of a plastic material, which is relatively inexpensive. The bonding material 6, which consists of resin, glass, metal, etc., is previously applied to the bonding positions on the cover 5. In the semiconductor device shown in FIG. 13, the cover 5 consists of a ceramic material (manufactured by Kyocera Corporation) as shown in FIG. 14.

In the above-described plastic-molded-type hollow semiconductor device, the bonding material is applied to the bonding positions on the cover 5 beforehand, and the cover 5 and the base 2 are bonded together after having been separately pre-heated. The pre-heating temperature is close to the melting point or curing temperature of the bonding material 6. The ambrent gas at the time of bonding is generally required to be an inert gas. However, air may also be used. The ambrent is also pre-heated to the same temperature as the base 2 and the cover 5.

In the bonding of the base 2 and the cover 5, a balance in the temperatures of the base 2, of the cover 5 and of the cavity 4 defined therebetween, is very important. When this balance cannot be maintained, a through-hole 8 is generated in the bonding material 6 as shown in FIG. 15, resulting in a deterioration in airtightness and reliability.

This phenomenon is attributable to the fact that the temperature of the inner gas trapped in the cavity 4 is lower than the bonding temperature of the base 2 and the cover 5, which are bonded together after having been separately pre-heated. Thus, the inner gas expands due to a temperature rise as a result of the bonding, thereby causing the pressure in the cavity, which has a fixed volume, to rise. As a result, the inner gas forces its way to the exterior, thereby causing the through-hole 8 to be generated. The tendency for this phenomenon to occur was more conspicuous when the bonding material was a thermosetting resin.

Further, the generation of the through-hole 8 not only is the main cause for a deterioration of the reliability of the semiconductor device but also leads to a reduced yield.

SUMMARY OF THE INVENTION

This invention has been made with a view toward solving the problems in the prior art as described above. It is the object of this invention to provide a plastic-molded-type hollow semiconductor device which involves no through-hole generation in the bonding material and which provides a high level of reliability and yield, and a process for manufacturing such a semiconductor device.

In accordance with the present invention, there is provided a plastic-molded-type semiconductor device comprising:

a base in which a semiconductor element is mounted and which has a cavity;

a cover arranged on the base in such a way as to make a closed space with the cavity; and a thermosetting resin bonding material provided in such a way as to cover edge surfaces of the cover as well as bonding surfaces of the base and the cover and so as to seal them.

Further, in accordance with the present invention, there is provided a process for manufacturing a plastic-molded-type semiconductor device, comprising the steps of:

placing a cover on a base in which a semiconductor element is mounted and which has a cavity, in such a way that a closed space is formed including the cavity;

pre-heating the base and the cover to a predetermined temperature;

applying a thermosetting resin bonding material to the base and the cover in such a way as to cover edge surfaces of the cover as well as bonding surfaces of the base and the cover; and allowing the thermosetting resin bonding material to cure.

DESCRIPTION OF THE PREFERRED EMBODIMENTS

First Embodiment

Figure 1:
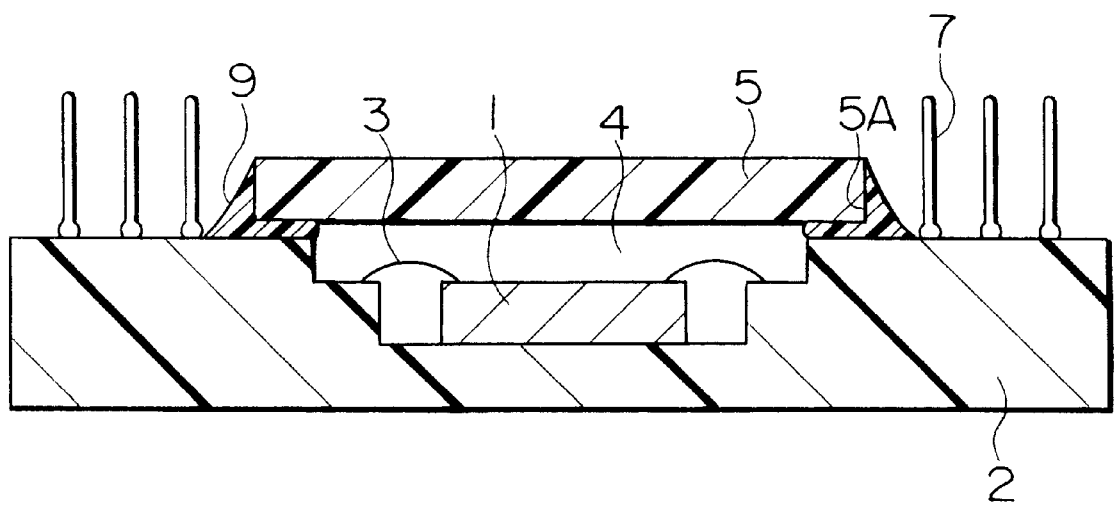
FIG. 1 a side sectional view showing a plastic-molded-type hollow semiconductor device according to a first embodiment of the present invention.

FIG. 1 is a side sectional view showing a plastic-molded-type hollow semiconductor device according to the first embodiment of this invention. (It should be noted here that in the accompanying drawings, the same or equivalent components are indicated by the same reference numerals.) Referring to FIG. 1, a thermosetting resin bonding material 9 (hereinafter referred to as the "bonding material 9") is applied to bonding surfaces of the base 2 and the cover 5 and to the entire edge surfaces 5A of the cover 5.

This plastic-molded-type hollow semiconductor device is manufactured in the following manner: first, as in the prior art, the semiconductor element 1 is mounted in the cavity 4 of the base 2, on which the external terminals 7 are provided. After this, the base 2 and the semiconductor element 1 are electrically connected to each other through the metal wiring 3.

Figure 2:
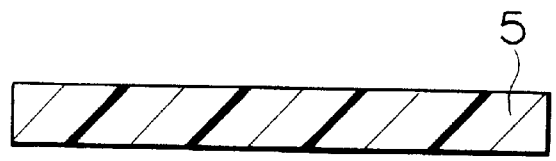
FIG. 2 is a side sectional view of a cover used in the device show in FIG. 1.
Figure 3:
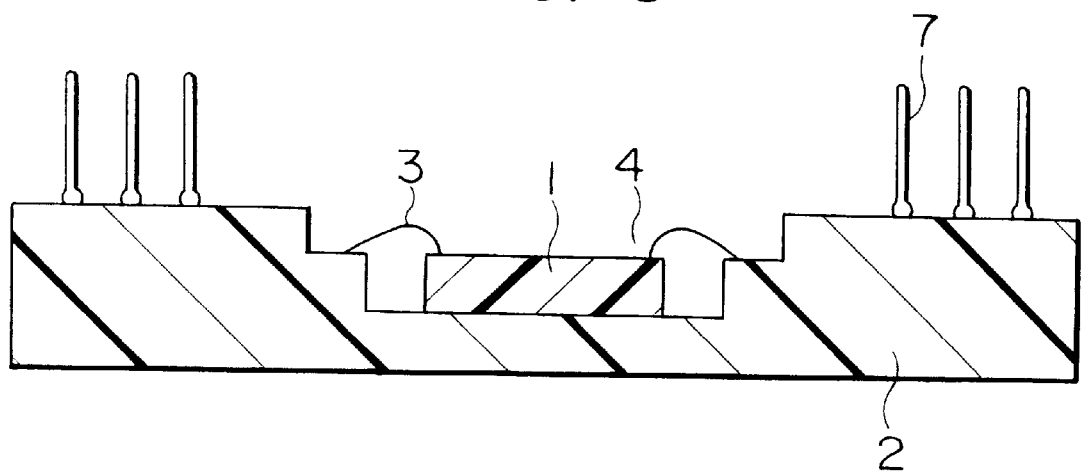
FIG. 3 is a side sectional view showing a base, and a semiconductor element used in the device shown in FIG. 1.
Figure 4:
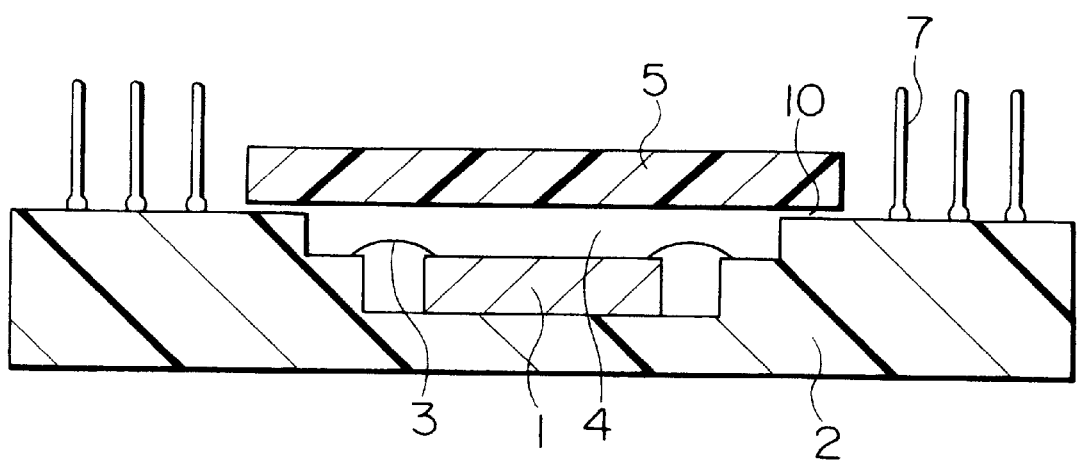
FIG. 4 is side sectional view of the base of the plastic-mold-type hollow semiconductor device with the cover placed thereon.
Figure 5:
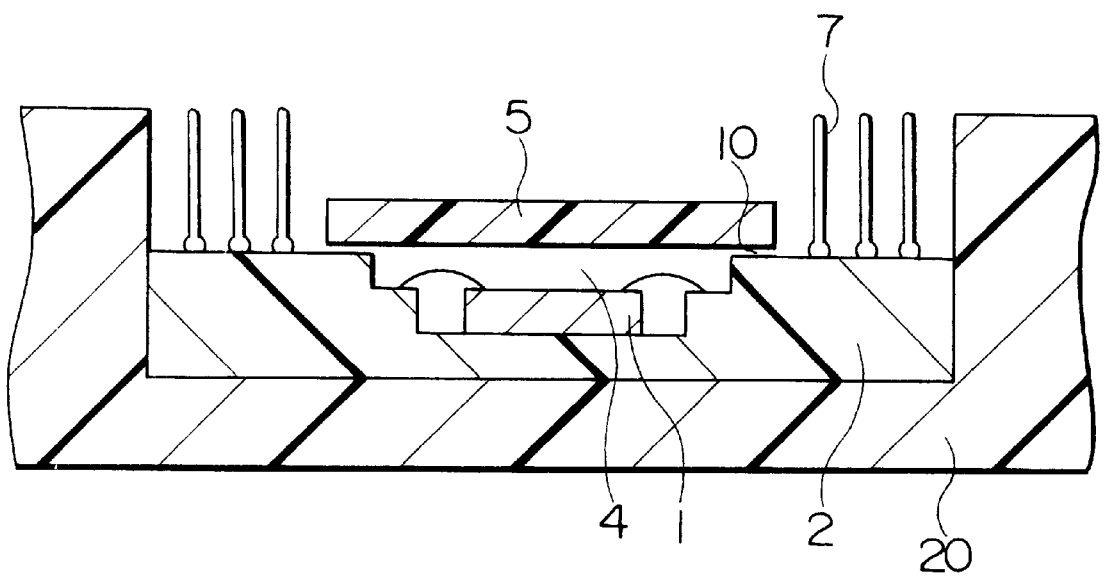
FIG. 5 is a side sectional view of the plastic-molded-type hollow semiconductor device mounted in a jig.

Then, the cover 5 is placed at a predetermined position on the base 2 (FIGS. 2 and 3). At this stage, the bonding material 9 is not yet applied to the bonding surfaces of the base 2 and the cover 5 (FIG. 4). A minute gap 10 of approximately 100 $\mu$m or less is generated in the interface between the base 2 and the cover 5 placed thereon. The generation of the gap 10, which is attributable to surface roughness, warping, etc. of the base 2 and the cover 5, is inevitable since no superfinishing is performed on the base 2 and the cover 5. In this condition, the base 2 and the cover 5 are mounted in a jig 20, as shown in in FIG. 5, and pre-heated to a fixed temperature, for example, of 150° C. which is close to the curing temperature of the bonding material 9. Within two minutes of their mounting in the jig, the base 2, the cover 5 and the inner gas inside the cavity 4 attain substantially the same temperature. Therefore, the gas in the cavity 4 does not expand even when the bonding material 9 is applied to the edge surfaces 5A and then heated in a subsequent process. In this way, the generation of a through-hole 8 in the bonding material 9, which occurs in the prior art, can be prevented.

Figure 6:
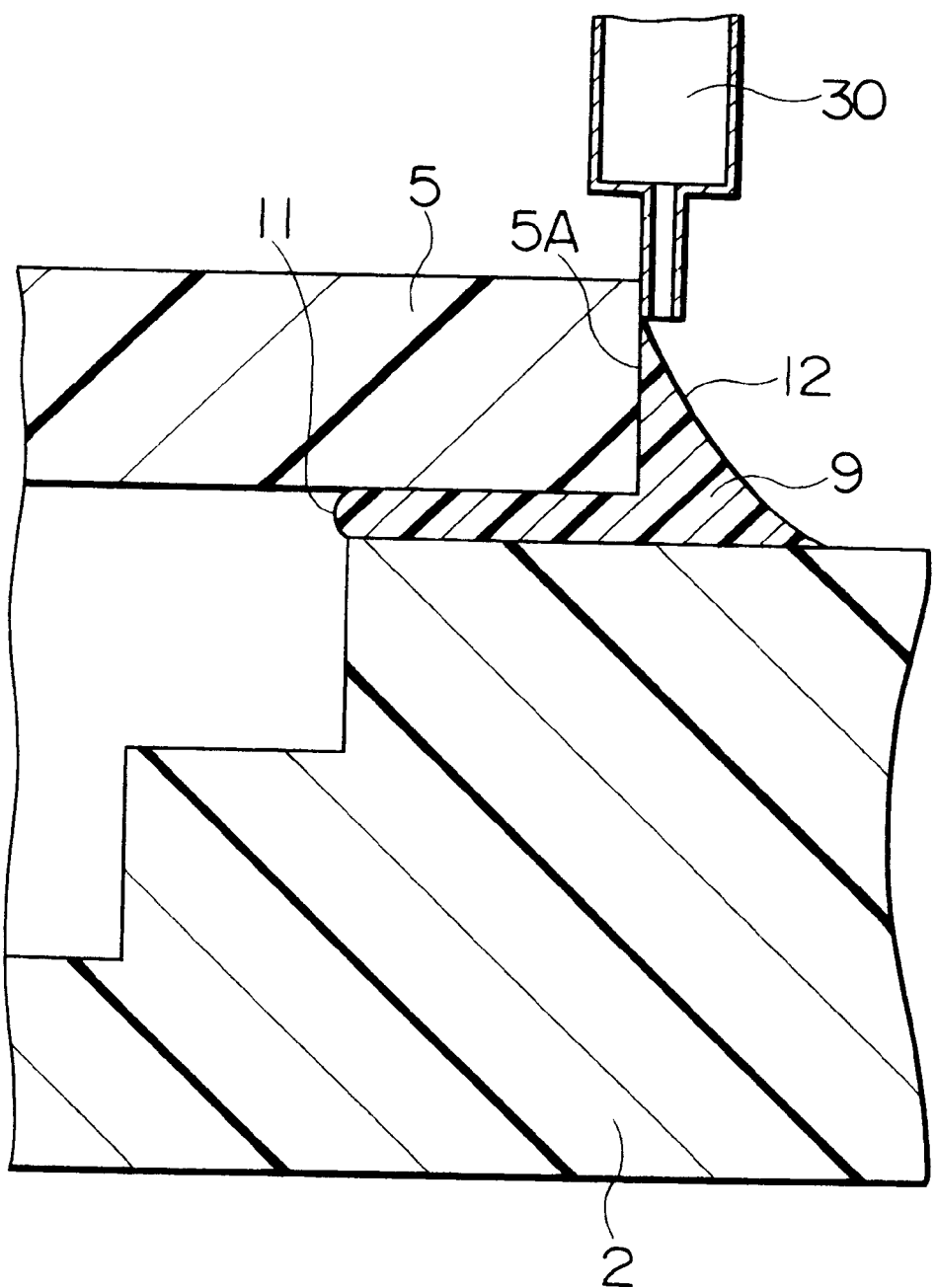
FIG. 6 is an enlarged side sectional view showing the joint section between the base and the cover.

Next, in this condition, the bonding material 9 is applied along the edge surfaces 5A of the cover 5. A suitable example of the bonding material 9 is a liquid thermosetting resin, such as an epoxy resin. In this regard a dispenser 30 as shown in FIG. 6 may be used to apply the bonding material 9 around the edge surfaces 5A of the cover 5. The bonding material 9, thus applied, enters the minute gap between the base 2 and the cover 5 by capillary action until it reaches the cavity 4 of the base 2. The bonding material 9, however, is prevented from advancing beyond an inner end 11 as shown in FIG. 6 due to surface tension. Surface tension is also acting on the edge surfaces 5A of the cover 5, so that a concave meniscus 12 is formed as shown in FIG. 6.

After the bonding material 9 is applied, it is allowed to cure inside the jig 20, whereby a semiconductor device whose cavity 4 forms a closed space is obtained.

Second Embodiment

Before placing the cover 5 on the base 2, a temporary-attachment resin 13 may be applied to the cover 5 and the base 2 to pre-heat the base 2 with the cover 5 temporarily mounted thereon.

Figure 7:
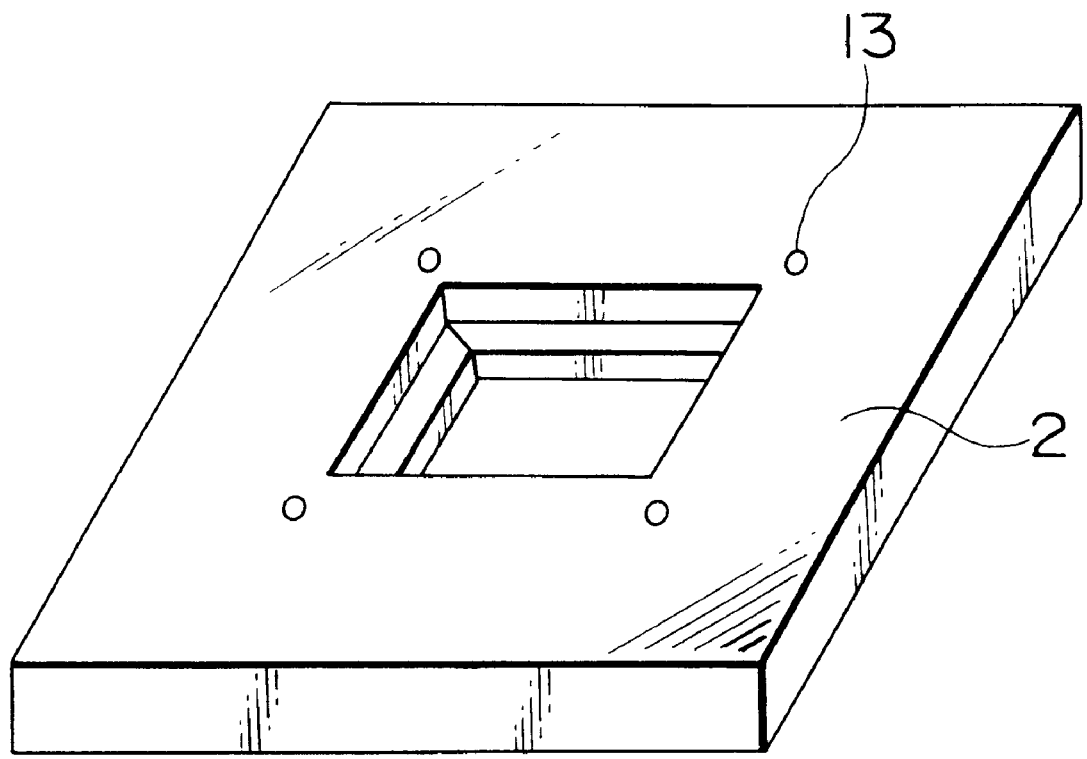
FIG. 7 is a perspective view showing how a temporary-attachment resin applied to the cover in accordance with an embodiment this invention.
Figure 8:
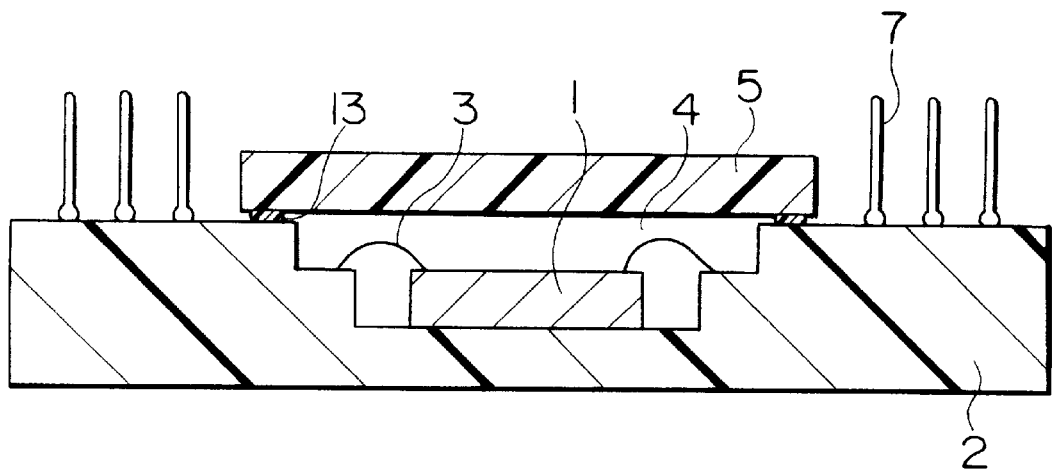
FIG. 8 is a side sectional view showing the cover of FIG. 7 placed on the base.

That is, as shown in FIG. 7, a temporary-attachment resin 13 is applied in spots at four corners of the cover bonding section of the base 2, which cover bonding section surrounds the cavity 4. In FIG. 7, the semiconductor element 1, etc. are omitted. Next, as shown in FIG. 8, the cover 5 is mounted on the base 2 after a predetermined positioning, and then the cover 5 and the base 2 are pre-heated. The temporary-attachment resin 13 is applied in such a way that the gap remaining between the cover 5 and the base 2 is not larger than 0.1 mm.

Due to the above arrangement, the bonding material 9 can smoothly enter between the base 2 and the cover 5. Further, if heat is applied in the subsequent process of applying the bonding material 9 to the edge surfaces of the cover 5, the cover 5 can be prevented from being displaced since it is firmly fixed to the base 2. Next, as in the first embodiment, the assembly is heated to a predetermined temperature by means of the jig. 20, and, in this condition, the bonding material 9 is applied and allowed to cure.

The temporary-attachment resin 13 may be the same thermosetting resin as the bonding material 9 or it may be selected from other thermosetting materials. A thermoplastic resin is undesirable since it is softened by heating.

Further, while in this embodiment the temporary-attachment resin 13 was applied in spots at four points, this should not be construed restrictively. It may be applied in spots at one point or more than one point. Generally speaking, the temporary-attachment resin should be applied in a discontinuous manner.

Third Embodiment

Figure 9:
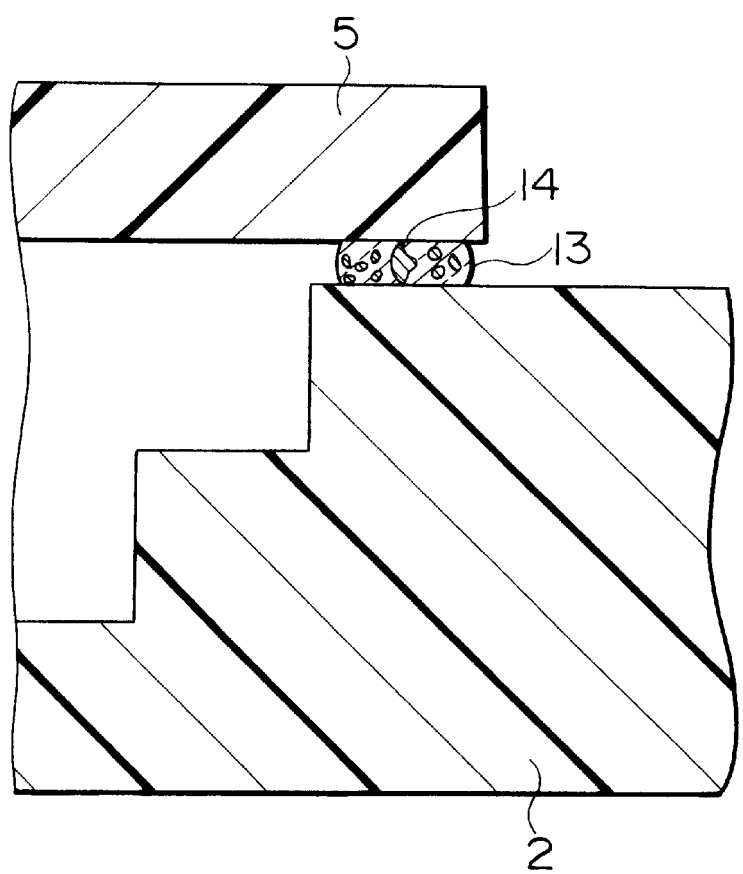
FIG. 9 is a side sectional view showing the cover attached go the base by means of a temporary-attachment resin to which a filler material is added in accordance with a third embodiment of this invention.

In the third embodiment, a filler 14 is added to the temporary-attachment resin 13 of the second embodiment. FIG. 9 is an enlarged sectional view showing the temporary-attachment resin 13 and the filler 14. The filler 14 consists, for example, of silica, alumina or the like whose maximum grain size is adjusted to 100 $\mu$m or less, and is added to the temporary-attachment resin 13 in order to control the size of the gap between the cover 5 and the base 2. Assuming that the cover 5 and the base 2 exhibit smooth planar surfaces, practically no gap may be left therebetween due to the weight of the cover 5, etc. In such a case, the filler 14 added to the temporary-attachment resin 13 proves effective since it ensures a gap having a size no smaller than a predetermined dimension.

Fourth Embodiment

Figure 10:
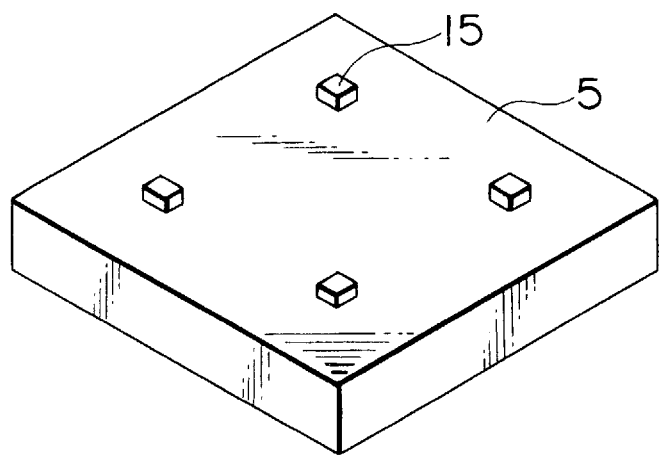
FIG. 10 is a perspective view of a cover according to a fourth embodiment of this invention.

FIG. 10 is a perspective view showing the cover 5 to be joined to the base 2. This cover 5 has protrusions 15 on the bonding surface thereof. The protrusions 15 are provided in such a way as to come into contact with the corners of the cavity 4. When the cover 5 is placed on the base 2, the protrusions 15 are placed at the corners of the cavity 4, thereby accurately positioning the cover 5 on the base 2.

While in the above example four protrusions 15 are provided, the number of the protrusions is not limited to four. The same effect can be obtained by providing two such protrusions which are diagonally opposed.

Fifth Embodiment

Figure 11:
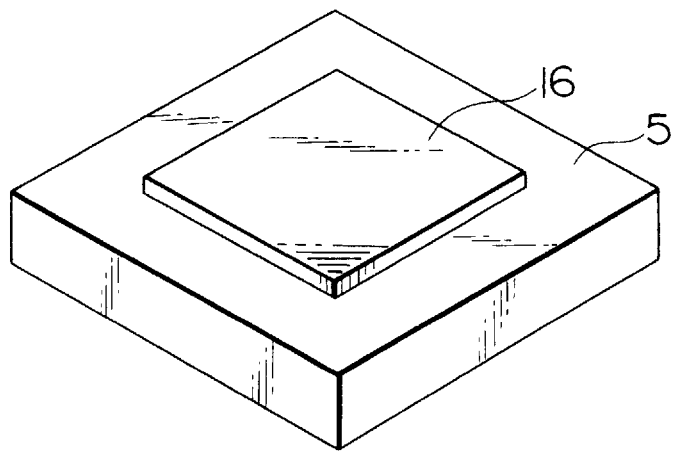
FIG. 11 is a perspective view of a cover according to a fifth embodiment of this invention.
Figure 12:
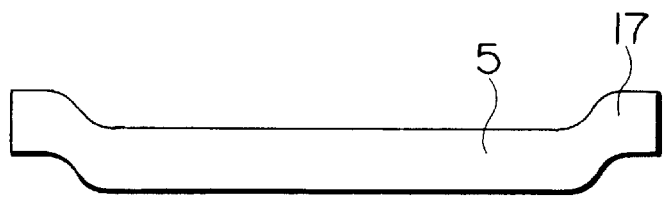
FIG. 12 is side view of the cover of the fifth embodiment of invention.
Figure 13:
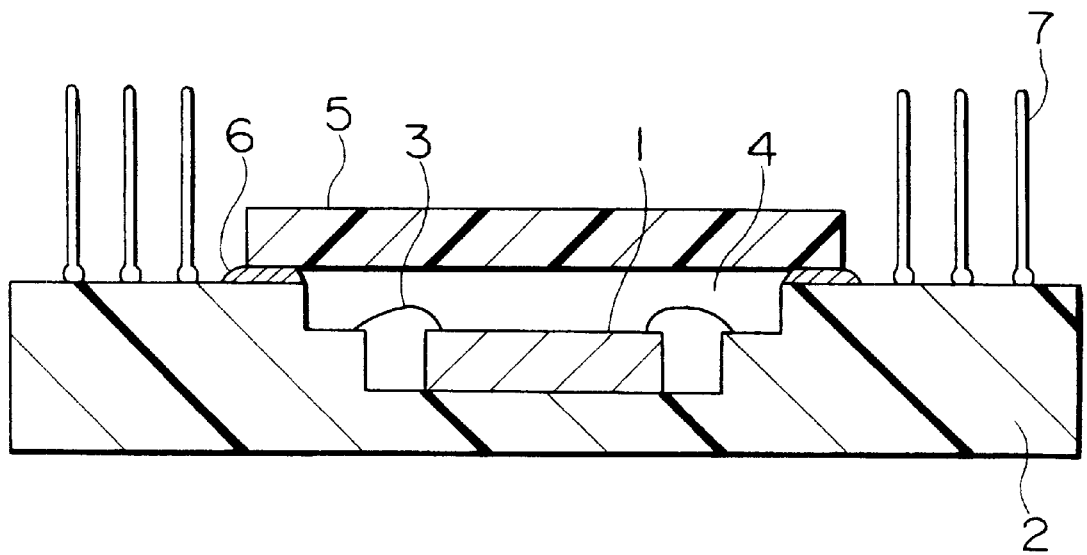
FIG. 13 is a side sectional view showing a conventional plastic-molted-type hollow semiconductor device.
Figure 14:
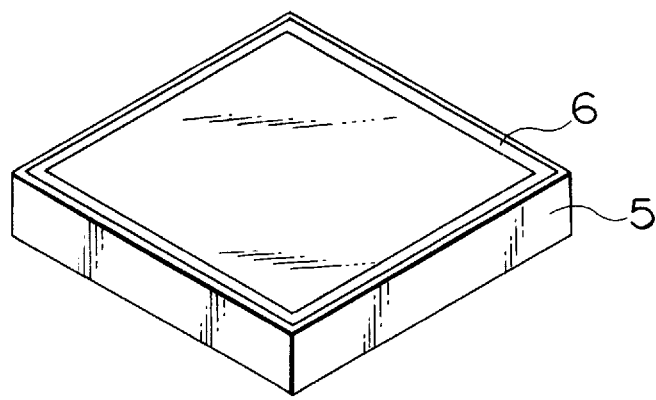
FIG. 14 is a perspective view of the cover of the device show in FIG. 13.
Figure 15:
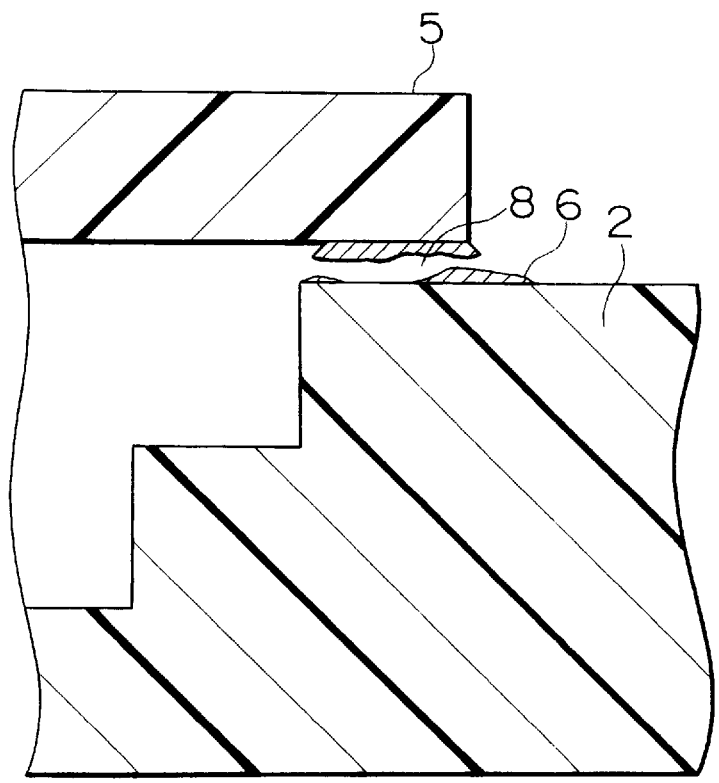
FIG. 15 is an enlarged side sectional view showing the conventions plastic-molded-type hollow semiconductor device with a through-hole generated therein.

Instead of providing the protrusions 15 on the cover 4, as in the fourth embodiment, it is also possible to form a raised surface 16, as shown in FIG. 11, or to provide stepped sections 17, as shown in FIG. 12, to obtain the same effect as in the fourth embodiment.

As described above, in accordance with this invention, the sealing between the base and the cover of the semiconductor device is improved, and the generation of a through-hole is prevented, thereby providing a highly reliable semiconductor device.

Further, since the temperature of the gas trapped between the the base and the cover is the same as the temperature of the base and the cover, the generation of a through-hole can be prevented, thereby providing a highly reliable semiconductor device.

In addition, due to the temporary attachment of the cover to the base, positional deviation between the base and the cover is prevented and, at the same time, the size of the gap between the base and the cover can be maintained at a predetermined dimension, thereby making it possible for the base and the cover to be reliably joined together by a thermosetting resin bonding material.

What is claimed is:

1. A semiconductor device mounted in a resin sealed container comprising:

a semiconductor element;

a base including a cavity in which said semiconductor element is mounted, said base having a bonding surface;

a cover having a bonding surface and a side surface transverse to the bonding surface of said cover, the bonding surface of said cover being disposed on the bonding surface of said base, thereby defining a closed volume including the cavity;

at least two spaced apart masses of a temporary bonding resin disposed between and contacting the bonding surfaces of said cover and said base and including solid particles having a grain size that determines spacing between the bonding surfaces of said cover and said base; and a thermosetting resin bonding material covering the side surface of said cover and disposed on the bonding surfaces of said base and said cover, sealing said cover to said base.

2. The semiconductor device according to claim 1 wherein said cover has a stepped section received by the cavity of said base.

* * * * *